(12) United States Patent
Taaffe et al.

(10) Patent No.: US 11,462,368 B2
(45) Date of Patent: Oct. 4, 2022

(54) ACTUATOR ASSEMBLY FOR ELECTRICAL SWITCHES HOUSED IN AN ENCLOSURE

(71) Applicant: Hubbell Incorporated, Shelton, CT (US)

(72) Inventors: Steven John Taaffe, Frontenac, MO (US); Anthony Dale Borzillo, St. Louis, MO (US); Steven Howard Maddux, Arnold, MO (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 16/355,031

(22) Filed: Mar. 15, 2019

(65) Prior Publication Data

US 2019/0287741 A1    Sep. 19, 2019

Related U.S. Application Data

(60) Provisional application No. 62/644,898, filed on Mar. 19, 2018.

(51) Int. Cl.
*H01H 9/04* (2006.01)
*H01H 3/20* (2006.01)
(Continued)

(52) U.S. Cl.
CPC ............. *H01H 9/045* (2013.01); *H01H 3/06* (2013.01); *H01H 3/20* (2013.01); *H02B 1/26* (2013.01); *H05K 5/0004* (2013.01)

(58) Field of Classification Search
CPC ............. H01H 9/045; H01H 3/20; H01H 3/06
See application file for complete search history.

(56) References Cited

U.S. PATENT DOCUMENTS 4,337,972 A    7/1982    Gill
5,286,935 A    2/1994    Mina
(Continued)

FOREIGN PATENT DOCUMENTS

CN       2386520        7/2000
WO    2018048878       3/2018

OTHER PUBLICATIONS

International Search Report and Written Opinion mailed in PCT/US19/022526 dated Jun. 10, 2019.
(Continued)

*Primary Examiner* — Felix O Figueroa
(74) *Attorney, Agent, or Firm* — Wissing Miller LLP

(57) ABSTRACT

An actuator assembly for actuating an electrical switch housed in sealed electrical enclosure is disclosed. The actuator assembly includes a handle assembly including a handle positioned on an exterior of a cover of the sealed enclosure, a trip bracket positioned within the sealed enclosure and a shaft connecting the handle to the trip bracket. A slider actuator is slidably mounted over an electrical switch positioned within the enclosure and operatively associated with or coupled to a toggle of the electrical switch. The slider actuator has a drive link which is adapted to engage the trip bracket such that rotation of the handle activates the drive link which causes linear movement of the slider actuator to move the electrical switch between on and off positions. The use of the slider actuator allows a higher density of electrical switches to be stacked within the sealed enclosure.

38 Claims, 13 Drawing Sheets

(51) Int. Cl.
  *H02B 1/26* (2006.01)
  *H05K 5/00* (2006.01)
  *H01H 3/06* (2006.01)

(56) References Cited

U.S. PATENT DOCUMENTS

| | | | | |
|---|---|---|---|---|
| 5,288,958 A * | 2/1994 | Grunert | ............... | H01H 9/22 |
| | | | | 200/329 |
| 5,577,603 A | 11/1996 | Bogdanovs | | |
| 5,857,563 A | 1/1999 | Helmer | | |
| 5,860,514 A | 1/1999 | Beattie | | |
| 7,772,510 B2 | 8/2010 | Manahan | | |
| 7,952,039 B2 * | 5/2011 | Manahan | ............... | H01H 3/08 |
| | | | | 200/50.02 |
| 8,223,475 B2 * | 7/2012 | Baird | ............... | H01H 9/04 |
| | | | | 174/50.5 |
| 10,181,383 B2 * | 1/2019 | Manahan | ............... | H01H 3/54 |
| 10,263,400 B2 | 4/2019 | Taaffe | | |
| 2010/0263994 A1 | 10/2010 | Manahan | | |
| 2018/0068812 A1 | 3/2018 | Taaffe | | |

OTHER PUBLICATIONS

International Preliminary Report on Patentability mailed in corresponding International Application PCT/US2019/22526 dated Oct. 1, 2020.

* cited by examiner

ACTUATOR ASSEMBLY FOR ELECTRICAL SWITCHES HOUSED IN AN ENCLOSURE

CROSS REFERENCE TO RELATED APPLICATIONS

The present application is based on and claims benefit from U.S. Provisional Patent Application Ser. No. 62/644,898 filed on Mar. 19, 2018 entitled "Actuator Assembly for Electrical Switches Housed in an Enclosure" the contents of which are incorporated herein in their entirety by reference.

BACKGROUND

Field

The present disclosure relates to actuator assemblies for electrical switches within environmentally sealed enclosures, and more particularly to actuator assemblies for explosion-proof circuit breaker enclosures.

Description of the Related Art

In environments containing flammable vapors, arc producing circuit breakers are enclosed within explosion-proof enclosures. Explosion proof enclosures provide a measure of safety by creating a barrier between flammable gases and the circuit breakers such that arcs generated by the activation of the circuit breakers does not result in ignition of the flammable gases. The circuit breakers inside the enclosure are designed to be toggled or tripped from outside the enclosure by an actuator assembly without opening the enclosure cover. The actuator assembly typically includes a shaft that couples a handle located outside the enclosure cover to a toggle of the circuit breaker located under the cover.

As can be appreciated, flame-proof enclosures are very expensive compared to ordinary location enclosures. As such, it is important to increase the density of circuit breakers in the enclosure as much as possible to reduce cost. Conventional actuator assemblies are relatively large in size and require additional spacing between adjacent circuit breakers. As a result, manufacturers are forced to use much larger enclosures, which increases the overall cost to manufacture such flame-proof enclosures.

Therefore, there is a need to provide an improved actuator assembly that allows a higher density of circuit breakers to be installed in an enclosure, which reduces the overall cost to manufacture such flame-proof enclosures.

SUMMARY

The present disclosure provides exemplary embodiments of actuator assemblies used to toggle electrical switches installed in a sealed electrical switch enclosure between "on" and "off" positions. The electrical switch enclosures typically include a body and a cover. In one exemplary embodiment, an actuator assembly that can be used with such electrical switch enclosures includes a slider actuator and a handle assembly. The slider actuator is associated with an electrical switch installed within the enclosure. The slider actuator is configured to be slidably mounted over the electrical switch and to engage a toggle and/or toggle extender of the electrical switch. The slider actuator includes a drive link having first and second surfaces. The handle assembly includes a handle which is positioned on an exterior of the cover of the enclosure when mounted to the enclosure, a trip bracket which is positioned below the cover when installed within the enclosure, and a shaft that connects the handle to the trip bracket. The trip bracket has a first ear extending in a direction toward the drive link that faces the first surface of the drive link and a second ear extending in a direction toward the drive link that faces the second surface of the drive link. In this configuration, rotation of the handle causes the trip bracket to rotate, and rotation of the trip bracket causes linear movement of the slider actuator so that the electrical switch can toggle between "on" and "off" positions.

In another exemplary embodiment, the actuator assembly includes a handle assembly, a slider actuator and drive link. The handle assembly includes a handle, a trip bracket and a shaft. The handle is positioned on the exterior of the cover of the enclosure when mounted to the enclosure. The trip bracket is positioned within the enclosure when installed, and the shaft connects the handle to the trip bracket. The slider actuator includes a first recess configured to be positioned over a toggle of a circuit breaker installed in the enclosure, and a second recess formed within the first recess and configured to receive a toggle and/or toggle extender of the circuit breaker. The drive link is adapted to engage the trip bracket when installed. In this configuration, rotation of the handle causes rotation of the trip bracket, and rotation of the trip bracket translates to linear movement of the slider actuator so that the second recess within the slider actuator can move the toggle of the circuit breaker.

The actuator assembly may also include at least one wedge extending from a wall of the first recess adjacent the second recess so that the at least one wedge can engage the toggle of the circuit breaker when the slider moves.

The present disclosure also provides exemplary embodiments of sealed electrical switch enclosures that incorporate the actuator assemblies used to toggle electrical switches installed in the sealed enclosure between "on" and "off" positions. In one exemplary embodiment, the electrical switch enclosure includes an enclosure body, a cover that is removably secured to the enclosure body, a plurality of electrical switches mounted within the enclosure body, and a plurality of actuator assemblies. The cover has a plurality of openings extending through the cover. Each of the plurality of electrical switches includes an upper part having a toggle movable between an on-position and an off-position, and a lower part for mounting the electrical switch within the enclosure.

In this exemplary embodiment, one of the plurality of actuator assemblies is associated with or corresponds to one of the plurality of electrical switches. Each of the plurality of actuator assemblies include a handle assembly and a slider actuator. The handle assembly has a shaft, a handle and a trip bracket. The shaft extends through one of the plurality of openings in the cover. The handle is attached to an end of the shaft extending from the exterior of the cover and the trip bracket is attached to an end of the shaft below the cover within the enclosure. The slider actuator is slidably mounted over one of the electrical switches and has a recess in which a toggle of the electrical switch is inserted. The slider actuator has a drive link that extends in a direction towards the cover and has a first surface and a second surface. The trip bracket includes a first ear and a second ear that straddle the drive link such that the first ear faces the first surface of the drive link and the second ear faces the second surface of the drive link. In this configuration, rotation of the handle causes rotation of the trip bracket, and rotation of the trip bracket translates to linear movement of the slider actuator causing the toggle to move to the on-position or the off-position.

In another exemplary embodiment, the electrical switch enclosure includes an enclosure body, a cover removably secured to the enclosure body, a plurality of electrical switches mounted within the enclosure body, and a plurality of actuator assemblies. The cover has a plurality of openings extending through the cover. The plurality of electrical switches includes an upper part having a toggle and toggle extender movable between an on-position and an off-position, and a lower part for mounting the electrical switch within the enclosure. One of the plurality of actuator assemblies is associated with one of the plurality of electrical switches. Each of the plurality of actuator assemblies include a handle assembly and a slider actuator. The handle assembly has a shaft, a handle and a trip bracket. The shaft extends through one of the plurality of openings in the cover. The handle is attached to an end of the shaft on the exterior of the enclosure above the cover, and the trip bracket is attached to an end of the shaft within the enclosure below the cover. The slider actuator is slidably mounted over the toggle and/or the toggle extender. More specifically, the slider actuator includes a first recess in which the toggle is positioned, a second recess formed within the first recess in which the toggle extender is positioned. The slider includes a drive link that is operatively coupled to the trip bracket, such that rotation of the handle causes rotation of the trip bracket, and rotation of the trip bracket translates to linear movement of the slider actuator so that the slider actuator moves the toggle extender and toggle to the on-position or the off-position.

The actuator assemblies may also include at least one wedge extending from a wall of the first recess so that the at least one wedge engages the toggle or the toggle extender when the toggle and toggle extender move to the on-position or the off-position.

BRIEF DESCRIPTION OF THE DRAWINGS

The figures depict embodiments for purposes of illustration only. One skilled in the art will readily recognize from the following description that alternative embodiments of the structures illustrated herein may be employed without departing from the principles described herein, wherein.

DETAILED DESCRIPTION

The present disclosure provides embodiments of explosion-proof switch enclosures that can be used in environments where flammable gases and liquids may be present. For ease of description, the explosion-proof switch enclosure according to the present disclosure may be referred to as the "enclosure" in the singular and the "enclosures" in the plural.

Figure 1:
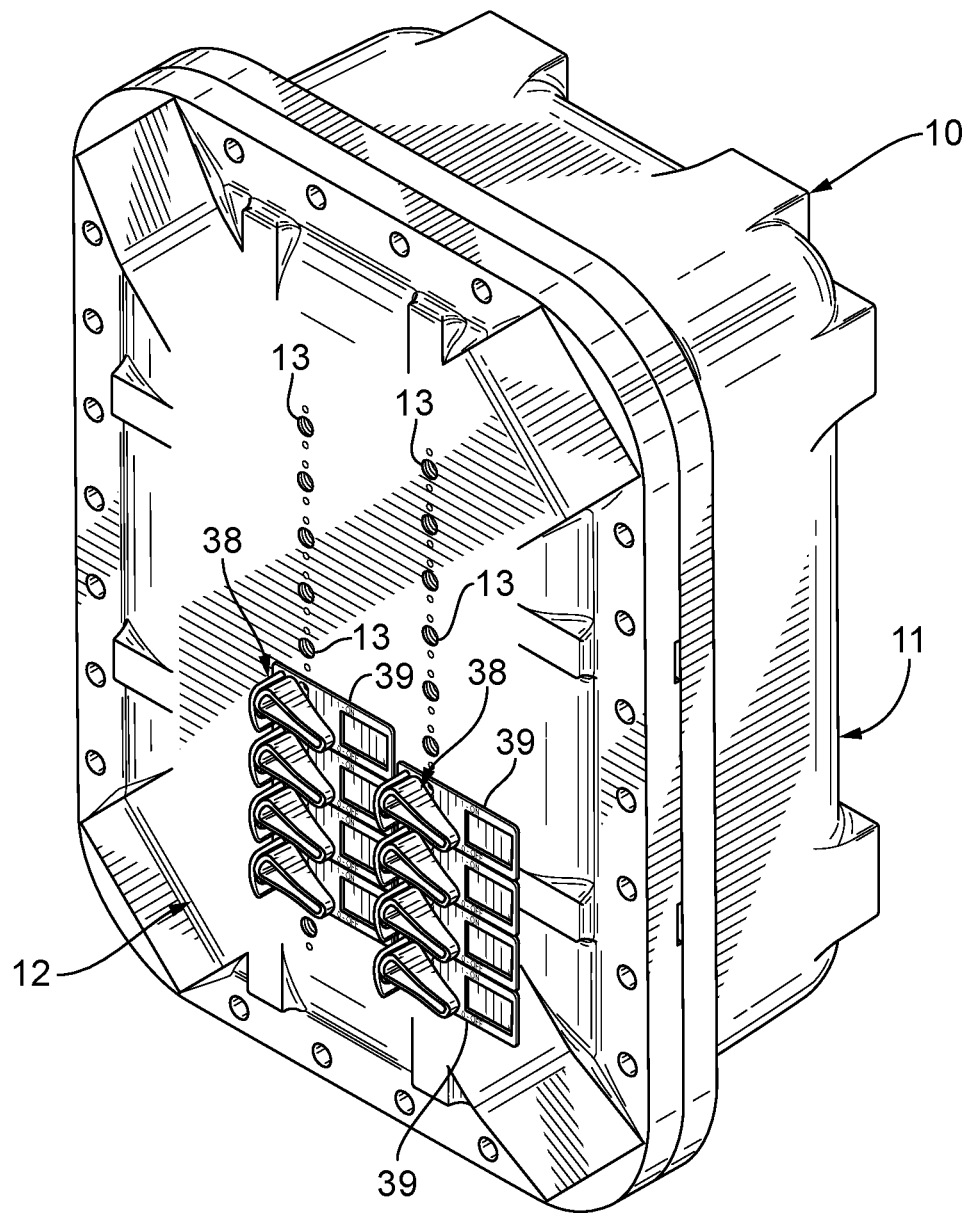
FIG. 1 is an exemplary embodiment of an enclosure according to the present disclosure illustrating a cover sealed to a body of the enclosure.
Figure 2:
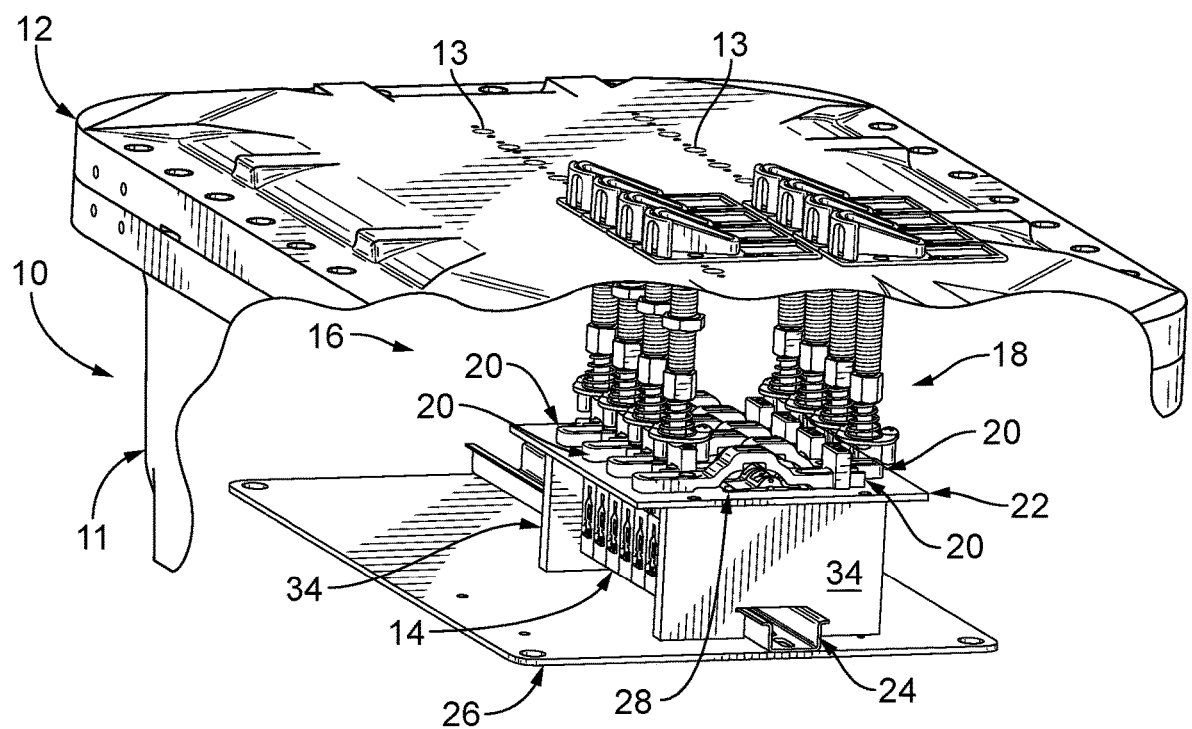
FIG. 2 is a cut away perspective view of the enclosure of FIG. 1 revealing an interior of the enclosure and illustrating an exemplary embodiment of an actuator assembly according to the present disclosure.
Figure 3:
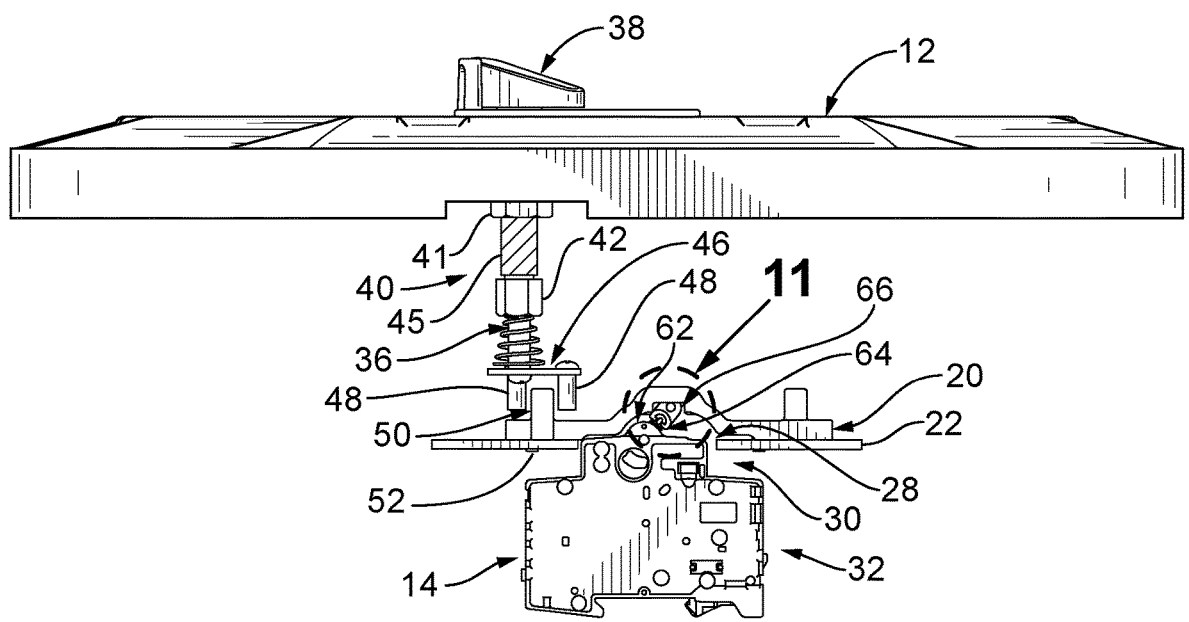
FIG. 3 is a side elevation view of the cover of the enclosure and actuator assembly of FIG. 2.

Referring to FIGS. 1-3, an exemplary embodiment of an enclosure according to the present disclosure is shown. The enclosure 10 includes a body 11 and a cover 12 that can be releasably secured to the body 11 so that the cover is sealed to the body using for example, a gasket, O-ring or other known sealing member. The cover 12 is sealed so that flammable gases and liquids may not enter the body 11 as is known.

The enclosure 10 also includes one or more electrical switches 14 that are affixed to a metal rail 24, e.g., a DIN rail, within the body 10 and stacked in a side-by-side relationship on the metal rail 24. The metal rail 24 is attached to a sub-panel 26 by mechanical or adhesive fasteners, such as screws, in a conventional manner. The sub-panel 26 in turn is attached to the bottom of the body 11 with mechanical or adhesive fasteners, such as screws or epoxy adhesives. Non-limiting examples of the electrical switches 14 that may be housed within the enclosure 10 include, branch circuit breakers, main circuit breakers, single pole toggle switches, multi-pole toggle switches and other types of switches. The exemplary embodiments described herein provide an enclosure 10 having a plurality of circuit breakers 14 so that for ease of description the switches 14 may also be referred to herein as circuit breakers 14.

Referring to FIG. 2, within the body 11 of the enclosure 10 one or more side spacer plates 34 are affixed to the metal rail 24 by, for example, sliding the side spacer plates 34 onto the metal rail so as to sandwich the circuit breakers 14 between the side spacer plates 34 as shown. A front panel 22 is attached to the side spacer plates 34 with screws to securely fix the position of the circuit breakers 14 within the enclosure 10 and on the metal rail 24. The front panel 22 has a rectangular opening 28 through which the toggles 64, seen in FIG. 3, and toggle guides/guards 62 extend. The toggles 64 extending above the front panel 22 are engaged by the slider actuators 20 as described below. The toggle guides 62 are provided to reduce the side to side movement of the toggles 64. The front panel 22 is preferably positioned relatively flush with a top surface of the upper part 30, seen in FIG. 3, of each circuit breaker 14 on the metal rail 24.

Figure 4:
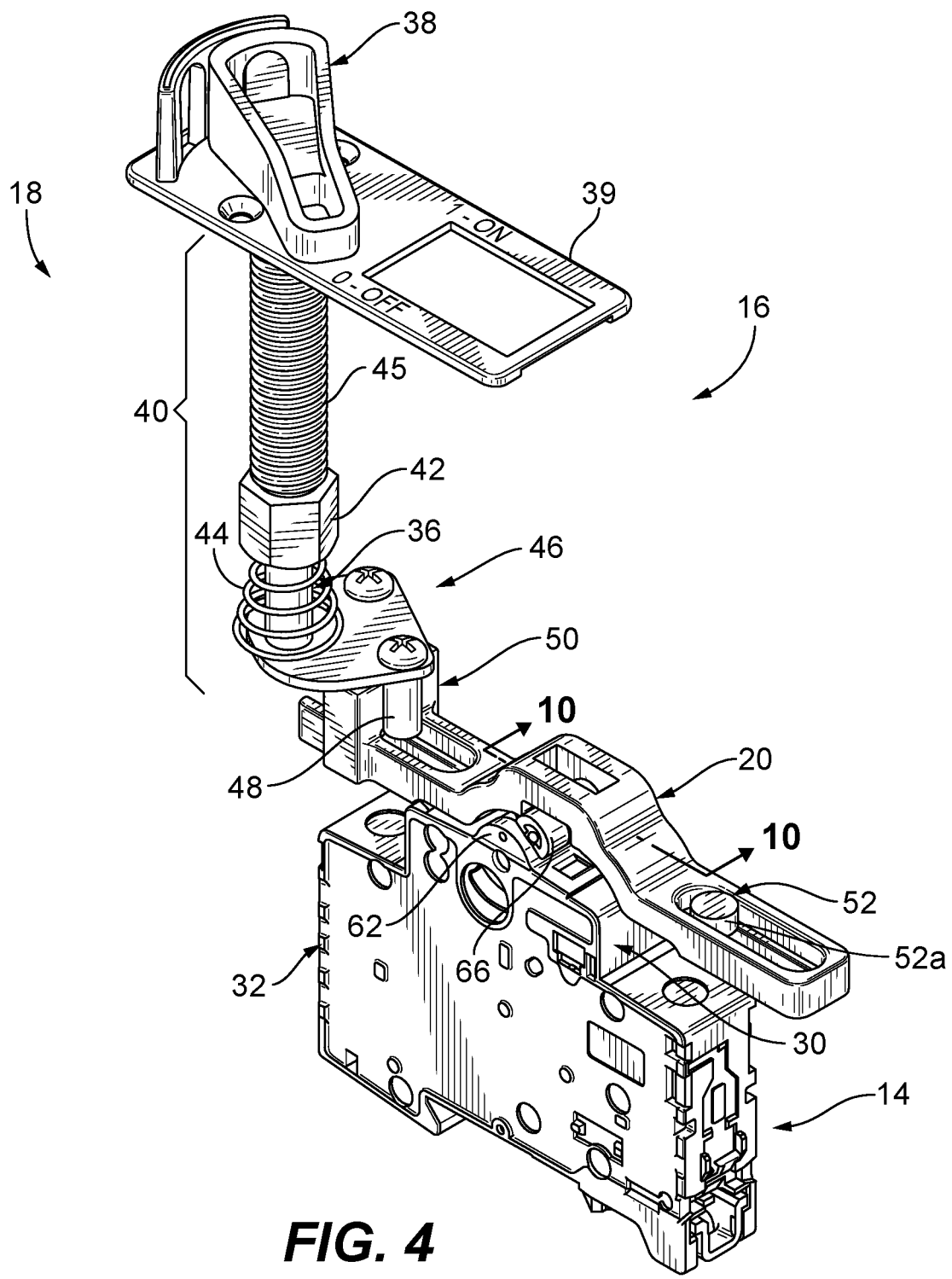
FIG. 4 is a top perspective view of the actuator assembly of FIG. 3 positioned relative to a switch device.

Referring to FIGS. 3 and 4, each circuit breaker 14 includes an upper part 30 and a lower part 32. The upper part 30 includes a toggle 64 and a toggle guide 62. In the embodiment shown, an optional toggle extender 66 may be attached to the toggle 64 to provide a larger contact area for toggling the circuit breaker 14 by a slider actuator 20. Such circuit breakers are known. A non-limiting example of a suitable circuit breaker is the Model S201-C20 from ABB of Zurich, Switzerland.

Referring to FIGS. 2-4, the present disclosure provides one or more actuator assemblies 16 used to toggle each circuit breaker 14 between "on" and "off" positions from the exterior of the enclosure 10. The number of actuator assemblies 16 provided with the enclosure 10 should equal the number of circuit breakers 14 installed in the enclosure. Each actuator assembly 16 includes a handle assembly 18, a slider actuator 20 and a drive link 50 between the handle assembly and the slider actuator.

Figure 5:
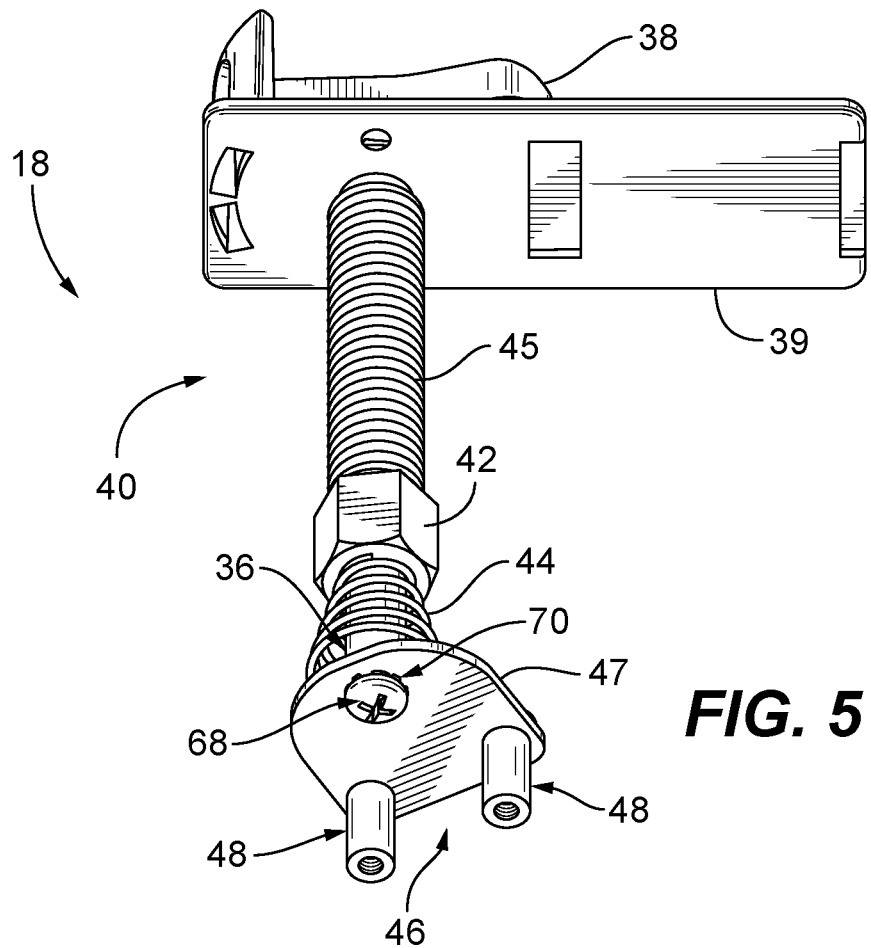
FIG. 5 is a bottom perspective view of an exemplary embodiment of a handle assembly according to the present disclosure, illustrating an exemplary embodiment of a trip bracket assembly according to the present disclosure.

Referring to FIGS. 3-5, each handle assembly 18 includes a shaft 36, a handle 38, a bushing assembly 40 and a trip bracket assembly 46. In this exemplary embodiment, the bushing assembly 40 includes a hollow threaded rod portion 45, a hexagonally shaped portion 42 and a spring 44. A proximal end of the threaded portion 45 is affixed to threaded apertures 13, seen in FIG. 1, in the cover 12 by a sealing nut 41 and sealed by, for example, a gasket (not shown). The hexagonally shaped portion 42, which may be in the form of, for example, a nut, is rotatably affixed to a distal end of the threaded rod portion 45. The spring 44 is positioned around the shaft 36 extending through the threaded rod portion 45 and between the hexagonally shaped portion 42 and the trip bracket assembly 46, as seen in FIG. 4. The hexagonally shaped portion 42 is used to increase or decrease the biasing force of the spring 44 by increasing or decreasing compression on the spring 44. The spring 44 allows the trip bracket assembly 46 and the shaft 36 to move axially relative to the bushing assembly 40 while maintaining sufficient biasing force on the trip bracket assembly 46. The threading on the threaded rod portion 45 of the bushing assembly 40 forces arcs generated by the toggling of the circuit breaker 14 that may escape the housing of the circuit breaker 14 to travel a longer distance, i.e., to spiral around the perimeter of the threaded rod portion 45, so that the arcs dissipate to minimize escape from the enclosure 10.

Continuing to refer to FIGS. 3-5, the shaft 36 is inserted through the bushing assembly 40 and is freely rotatable inside the bushing assembly. A proximal end of the shaft 36 is attached to the handle 38 on the exterior of the cover 12, and the distal end of the shaft 36 is attached to the trip bracket assembly 46, such that turning of the handle 38 turns the trip bracket in the substantially same circumferential direction. The trip bracket assembly 46 is attached to the bottom of the shaft 36 with, foe example, a fastener 68, such as a screw, seen in FIG. 5.

Referring to FIG. 5 an exemplary embodiment of the trip bracket assembly 46 according to the present disclosure is shown. In this exemplary embodiment, the trip bracket assembly 46 includes a trip plate 47 and a pair of ears 48. The trip plate 47 is attached to the shaft 36 extending through the bushing assembly 40 and the spring 44 by a fastener, such as screw 68, and lock washer 70. The ears 48 are secured to the trip plate 47 using mechanical or adhesive fasteners, such as screws or rivets, seen in FIG. 4. The ears 48 are configured to engage with the drive link 50, seen in FIG. 4, and provide a smooth actuation, e.g., sliding, of the slider actuator 20. For example, the ears 48 of the trip bracket assembly 46 can be formed in a desired shape, e.g., a convexly curved shape, a cylindrical shape or other desired shape, to facilitate uninterrupted actuation of the slider actuator 20. In another exemplary embodiment shown in FIG. 6, the trip bracket assembly 46 is a unitary member where the ears 48 are integrally or monolithically formed into the trip plate 47. As such, the trip bracket assembly 46 of this embodiment can be injection molded or stamped to reduce manufacturing costs. In addition, the ears 48 of the trip bracket assembly 46 can be molded or bent, shaped or otherwise formed into a desired shape, e.g., a convexly curved shape, a cylindrical shape or other desired shape. In the exemplary embodiments shown in FIGS. 5 and 6, the ears are cylindrical in shape.

Figure 6:
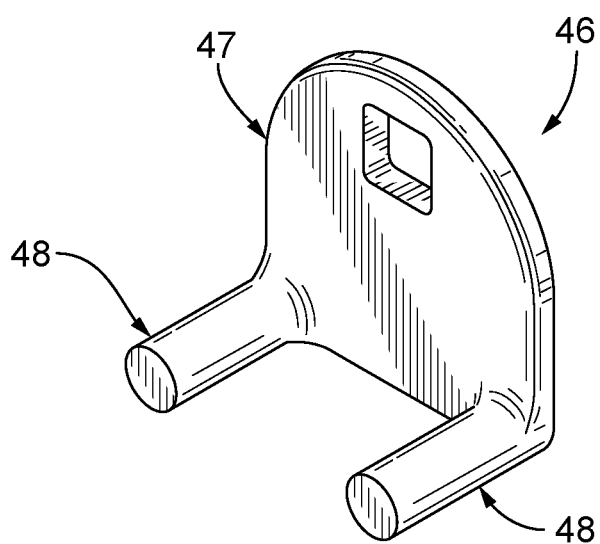
FIG. 6 is a bottom perspective view of another exemplary embodiment of the trip bracket assembly according to the present disclosure.

As shown in FIGS. 5 and 6, the ears 48 of the trip bracket assembly 46, which interact with the drive link 50, are radially offset from the longitudinal axis of the shaft 36. Because of this offset, the shaft 36 of the handle assembly 18 can be positioned over and between two adjacent circuit breakers 14. If adjacent handle assemblies 18 were positioned immediately next to each other on the same side of the circuit breakers 14, a certain amount of clearance spacing between adjacent circuit breakers 14 may be needed to accommodate the radially offset trip brackets assembly 46. Accordingly, for maximum density of circuit breakers 14, it would be preferable to install the handle assemblies 18 in a staggered manner such that the drive links 50 for adjacent slider actuators 20 are located on opposite sides of the toggle 64 of the circuit breaker 14 as described herein.

Referring now to FIGS. 3, 4, 7 and 8, an exemplary embodiment of the slider actuator 20 of according to the present disclosure is shown. Each slider actuator 20 includes a pair of oppositely disposed longitudinal slots 54 and a bridge 80 between the pair of longitudinal slots 54. Each slider actuator 20 is secured to the front panel 22 using guides 52. More specifically, each longitudinal slot 54 includes a lip 56 over which the head portion 52a of the guide 52 rides. A screw portion of the guide 52 is attached to the front panel 22 and the head portion 52a guides the sliding movement of the slider actuator 20. Non-limiting examples of a guide 52 include a shoulder screw or a head screw. The lips 56 provide a guide for sliding movement of the slider actuators 20 and limit vertical movement of the slider actuator 20 relative to the front panel 22.

Figure 7:
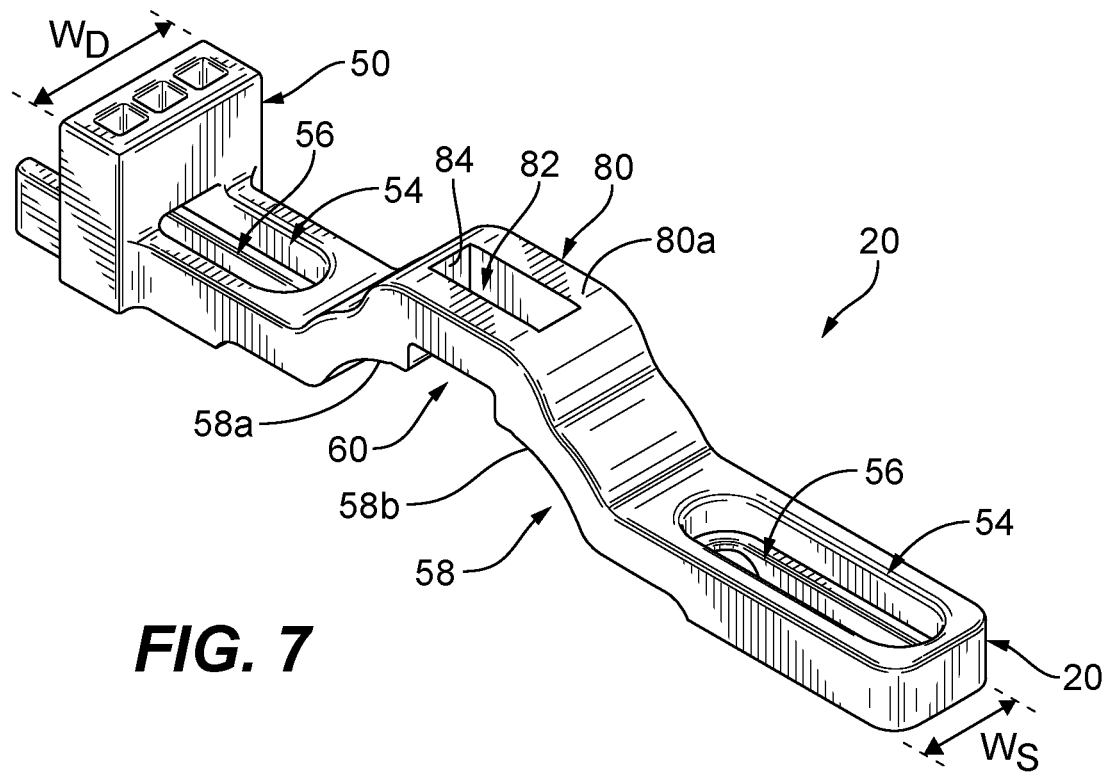
FIG. 7 is a top perspective view of an exemplary embodiment of a slider actuator of the actuator assembly of FIG. 4.
Figure 8:
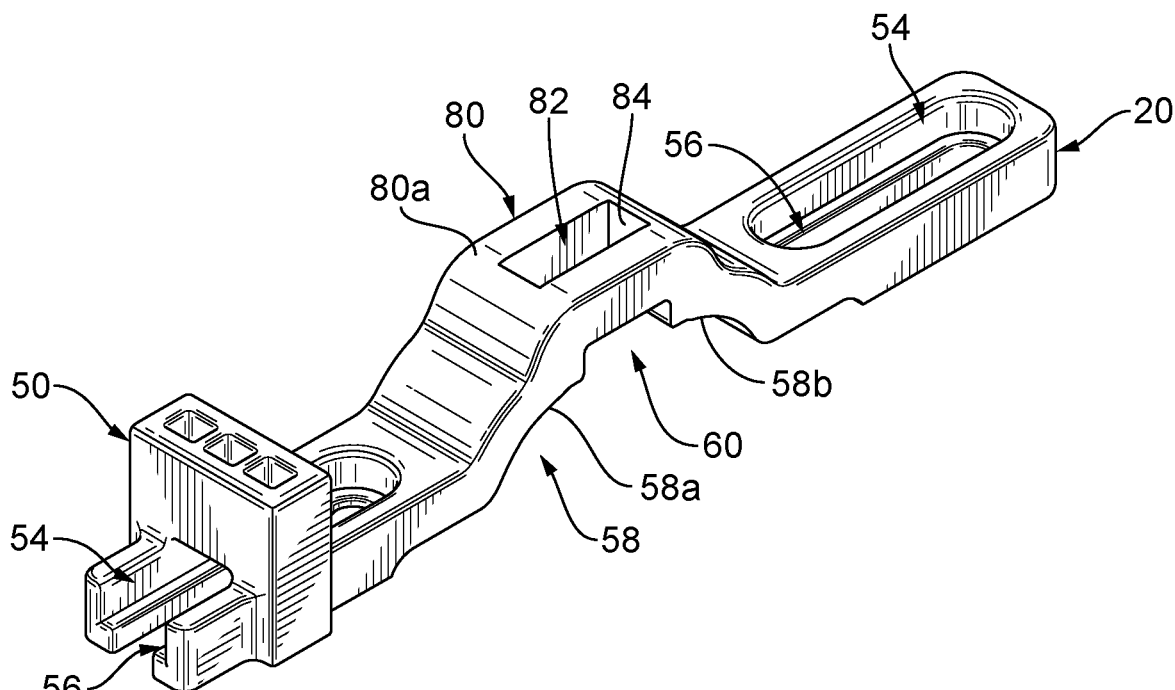
FIG. 8 is another top perspective view of the slider actuator of FIG. 4.
Figure 9:
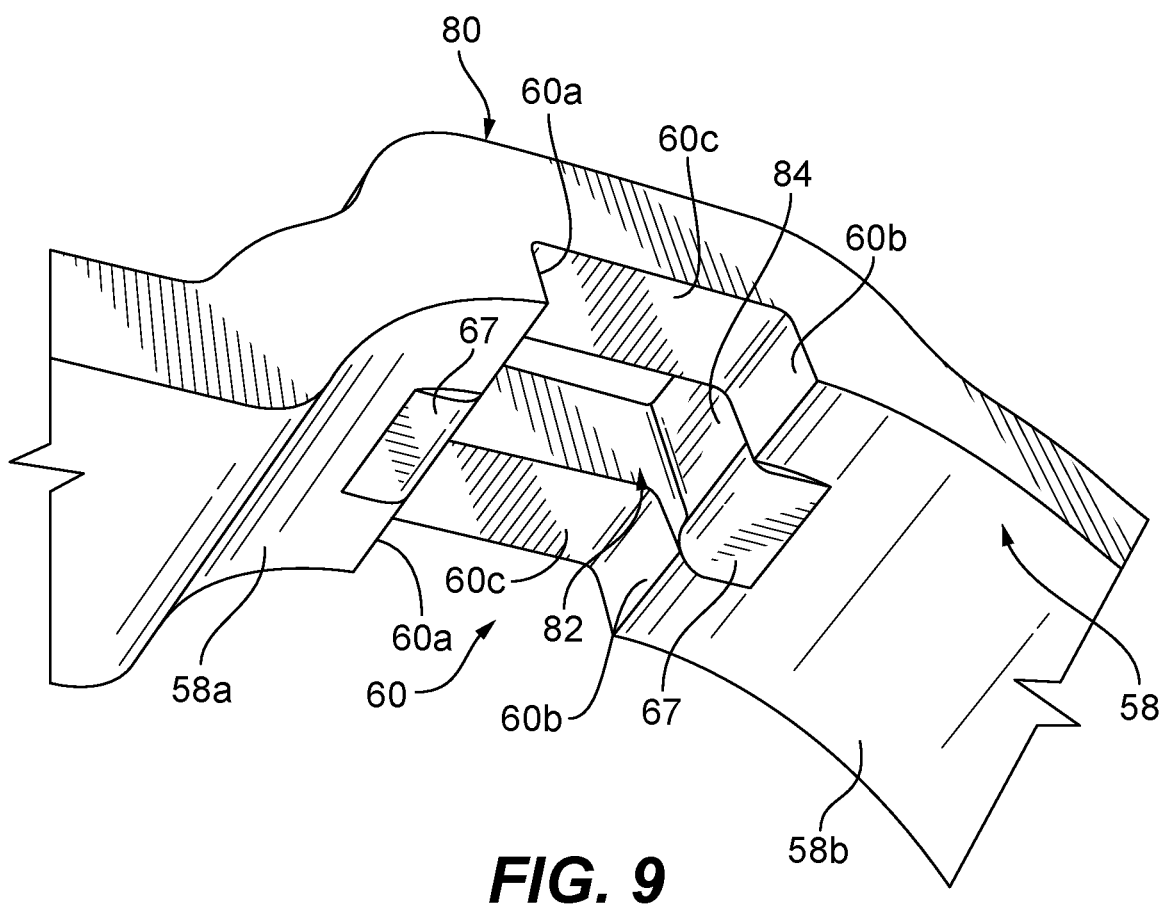
FIG. 9 is a bottom perspective view of a portion of the slider actuator of the actuator assembly of FIG. 4, illustrating a slot extending through a bridge portion of the slider actuator.

Referring to FIGS. 7-11, the bridge 80 includes a first recess 58 which has a generally arcuate shape and a second recess 60 formed within the first recess 58, which in this exemplary embodiment is generally rectangular in shape. The first recess 58 has a first upper wall 58a on one side of the bridge 80 and a second upper wall 58b on the opposite side of the bridge. The second recess 60 has end walls 60a and 60b and an upper wall 60c. A slot 82 extends from an upper surface 80a of the bridge 80 into the second recess 60, as seen in FIG. 9. The slot 82 includes end walls 84 that are preferably wider that then the side walls 60a and 60b of the second recess.

Figure 11:
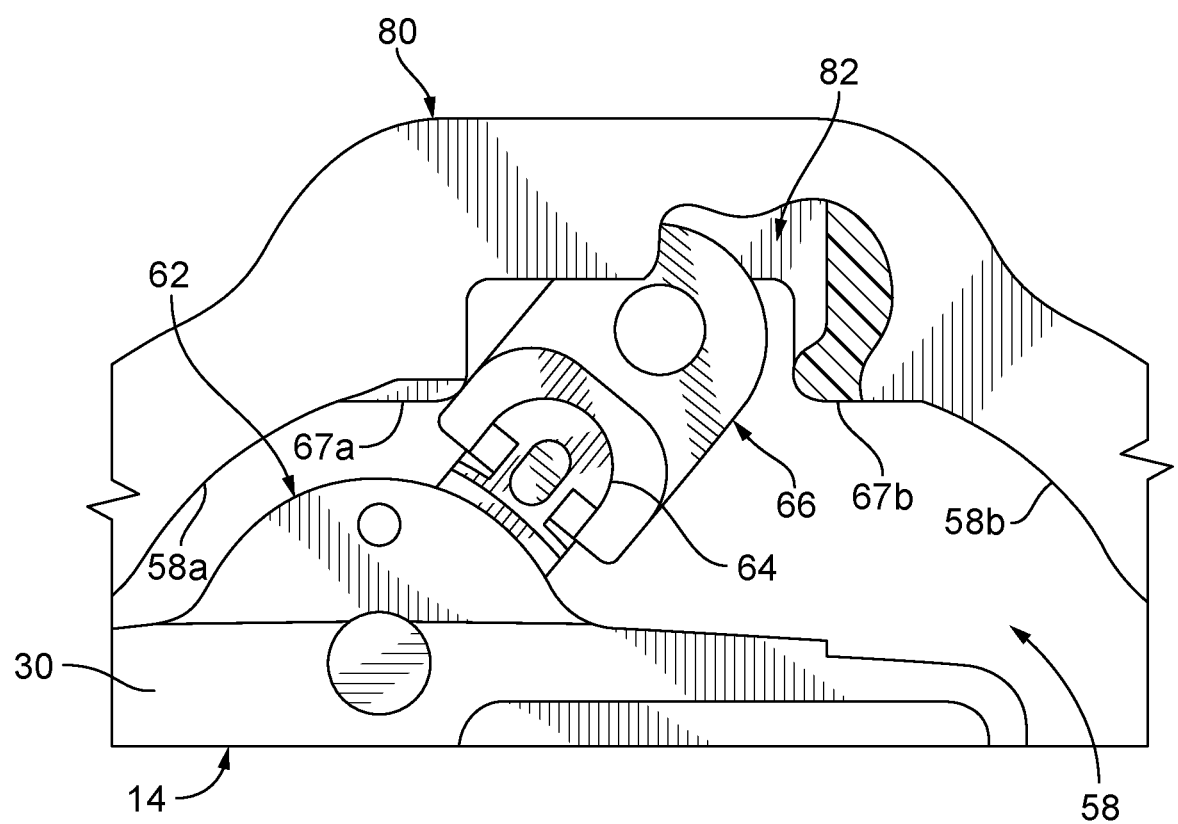
FIG. 11 is an enlarged side elevation view of a portion of the slider actuator of the actuator assembly of FIG. 3 taken from detail 11.

The first recess 58 is configured to be positioned over the curved toggle guide 62, seen in FIG. 11, of the circuit breaker 14 and to provide clearance for the sliding movement of the slider actuator 20 when toggling the circuit breaker 14 between the on-position and off-positions. The second recess 60 is configured to receive the toggle 64 of the circuit breaker 14 and/or the toggle extender 66. In the embodiment shown, a toggle extender 66 is attached to the toggle 64 to provide a larger contact area for toggling the circuit breaker 14 between the on-position and the off-position. Accordingly, the second recess 60 and slot 82 receives the toggle extender 66, such that a sliding movement of the slider actuator 20 slides the toggle 64 which in turn toggles the circuit breaker 14 between the "on" and "off" position.

Figure 10:
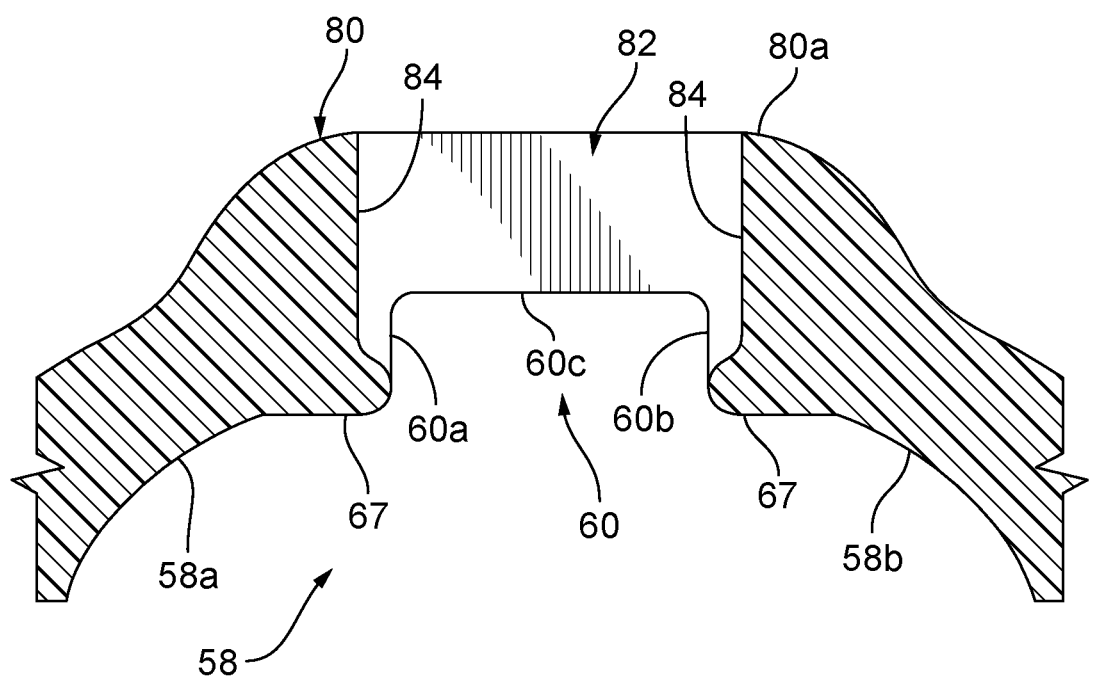
FIG. 10 is a partial cross-sectional view of a slider actuator of the actuator assembly of FIG. 4 taken from line 10-10.

Referring to FIGS. 9 and 10, the slider actuator 20 may also include one or more wedges 67 positioned within the first recess 58. For example, in the exemplary embodiment shown the slider actuator 20 includes two wedges 67. A first wedge 67 extends from the first upper wall 58a of the first recess 58 and is positioned adjacent end wall 60a of the second recess 60. Similarly, a second wedge 67 extends from the second upper wall 58b of the first recess 58 and is positioned adjacent end wall 60b of the second recess 60. The wedges 67 extend from an upper wall 58a and 58b of the first recess 58 and provides additional contact area between slider actuator 20 and the toggle extender 66 as the slider actuator 20 slides the toggle extender 66, in for example the direction of arrow "A" seen in FIG. 12.

In the exemplary embodiment shown in FIGS. 7-10, the slider actuator 20 has a width "$W_S$." The width $W_S$ of the slider actuator 20 may vary depending upon a number of factors including the number of circuit breakers to be installed in the enclosure 10 and the dimensions of the circuit breakers. As a non-limiting example, the width $W_S$ of the slider actuator 20 may be in the range of about 0.25 of an inch and about 1.0 inch, such as 0.55 of an inch. In the exemplary embodiment shown, the width of the slider actuator 20 is less than or equal to a width of the circuit breaker, such that the circuit breakers 14 can be stacked or sequentially aligned with minimal clearance therebetween or without any clearance therebetween. The drive link 50 has a width "$W_D$." The width $W_D$ of the drive link 50 may vary depending upon a number of factors including the number of circuit breakers to be installed in the enclosure 10, the dimensions of the circuit breakers, the distance the slider actuator 20 is to travel in order to move the toggle between the on-position and the off-position, and the dimensions of the trip bracket 46. As a non-limiting example, the width $W_D$ of the drive link 50 may be in the range of about 0.375 of an inch and about 1.5 inches, such as 0.75 of an inch. The width $W_D$ of the drive link 50 can be greater than the width of the circuit breaker 14 in this exemplary embodiment because the slider actuators 20 are installed in a staggered manner, and the drive links 50 of adjacent switches 14 are positioned on opposite sides of the toggle 64 of the circuit breakers 14, as seen in FIG. 2. In another exemplary embodiment, the width of each circuit breaker 14 is equal to or greater than the width of the drive link 50, e.g., equal to or greater than 0.75 inches. In this way, the circuit breakers 14 can be stacked or sequentially aligned tightly without the need to provide any clearance between them even when the slider actuators 20 are not installed in a staggered manner.

The slider actuator 20 according to the present disclosure is made of a single molded plastic material. Preferably, the slider actuator 20 is made from an acetal homopolymer resin material, such as Delrin™ manufactured and sold by the Dupont Corporation, due to its high structural integrity and self-lubricating properties.

Referring to FIGS. 7 and 8, the drive link 50 is a rectangular shaped member and is positioned over one of the longitudinal slots 54 (described below) in the slider actuator 20. The drive link 50 extends from the longitudinal slot 54 a distance that allows the ears 48 of the trip bracket assembly 46 to contact the drive link. In the embodiment shown, the slot 54 without the drive link 50 is closed on both ends and the slot with the drive link 50 is open on one end. The open end of the longitudinal slot 54 permits easy attachment or removal of the slider actuator 20 to the circuit breaker 14.

As noted above, each actuator assembly 16 is associated with a respective circuit breaker 14 such that each handle assembly 18, slider actuator 20 and drive link 50 is associated with the respective circuit breaker 14. The slider actuator 20 is slidably mounted over its associated circuit breaker 14 and the drive link 50 is operatively associated with or coupled to the ears 48 of the trip bracket assembly 46 such that rotation of the handle 38 causes rotation of the trip bracket assembly 46, and rotation of the trip bracket assembly causes linear movement of the slider actuator to toggle the circuit breaker between the "on" and "off" positions.

A method of assembling the actuator assembly 16 will now be described. In an enclosure 10, a desired number of circuit breakers 14, which can be of different sizes, are sequentially installed on rail 24 within the body 11 of the enclosure 10 so that the circuit breakers 14 are horizontally stacked between the side spacer plates 34, as seen in FIG. 2. The front panel 22 is then placed over the stacked circuit breakers 14 such that the toggle guides 62 and toggles 64 extend through the rectangular openings 28 in the front panel 22. The front panel 22 is then attached to the side spacer plates 34 via mechanical or adhesive fasteners, e.g., set screws (not shown), so that the front panel 22 is in a fixed position relative to the rail 24 and the enclosure body 11. For each circuit breaker 14, an associated slider actuator 20 is positioned on top of the circuit breaker, as seen in FIGS. 2 and 4. A pair of guides 52 are positioned in the longitudinal slots 54 and mounted to the front panel 22 so that the guides 52 ride along the lip 56 of the longitudinal slots 54 guiding the sliding movement of the slider actuator 20 relative to the toggle guides 62 and toggles 64. In the exemplary embodiment shown, the guides 52 are head screws that pass through the longitudinal slots 54 and are screwed into respective holes in the front panel 22. The head screws ride along the lip 56 of the longitudinal slots 54 guiding the sliding movement of the slider actuator 20 relative to the toggle guides 62 and toggles 64. Preferably, adjacent slider actuators 20 are positioned on the front panel such that their respective drive links 50 are on opposite sides relative to the toggles 64 of the circuit breakers 14, as seen in FIG. 2. Positioning the drive links 50 of adjacent slider actuators 20 on opposite sides of the toggle 64 of the circuit breakers 14 allows a maximum density of circuit breakers to be installed in the enclosure 10.

To attach each handle assembly 18 to the cover 12, an on-off plate 39, seen in FIG. 1, is positioned on the cover 12 so that an aperture in the on-off plate is aligned with the threaded through hole 13 in the cover 12. One end of the shaft 36 of the handle assembly 18 is then inserted through the respective hole 13 in the cover 12, and the handle 38 is attached to the portion of the shaft 36 extending above the cover 12. The threaded bushing 40 with the sealing nut 41, seen in FIGS. 3 and 4, and the hexagonally shaped portion 42 is then inserted over the free end of the shaft 36 below the cover 12. The sealing nut 41 is then rotated with a wrench while hexagonally shaped portion 42 is grabbed by another wrench to securely fix the bushing 40 to the cover 12. The spring 44 is inserted over the free end of the shaft 36 and the trip bracket assembly 46 is attached to the shaft 36 with the fastener 68 and lock washer 70, as seen in FIG. 5. As noted, the spring 44 biases the trip bracket assembly 46 in a downward direction.

Once all of the handle assemblies 18 are attached to the cover 12, the cover is closed so that the ears 48 extending from the trip plates 47 of the trip bracket assemblies 46 of each handle assembly 18 are positioned on both sides of their corresponding drive link 50 so that the ears 48 straddle the drive link. However, if one or more ears 48 land on top of its corresponding drive link 50, the spring 44 allows the trip bracket assembly 46 to move vertically momentarily until the ears 48 straddle the drive link 50 so that the ears face both sides of the drive link 50.

As can be appreciated, the actuator assembly 16 of the present disclosure allows a maximum number of circuit breakers to be positioned within the enclosure body 11 without clearance between them. For example, in a 24"×36"×8" enclosure 10, using conventional actuation assemblies allows about forty-two branch circuit breakers or one 4-pole main circuit breaker and thirty-six branch circuit breakers to be positioned inside the enclosure. By contrast, the actuator assembly 16 of the present disclosure allows about ninety branch circuit breakers to be positioned within the enclosure body 11, or one 4-pole main circuit breaker and seventy-two branch circuit breakers to be positioned within the enclosure body 11. As a result, installing the actuator assembly 16 of the present disclosure allows more than twice the number of circuit breakers to be installed in an enclosure 10 than using conventional actuation assemblies.

Figure 12:
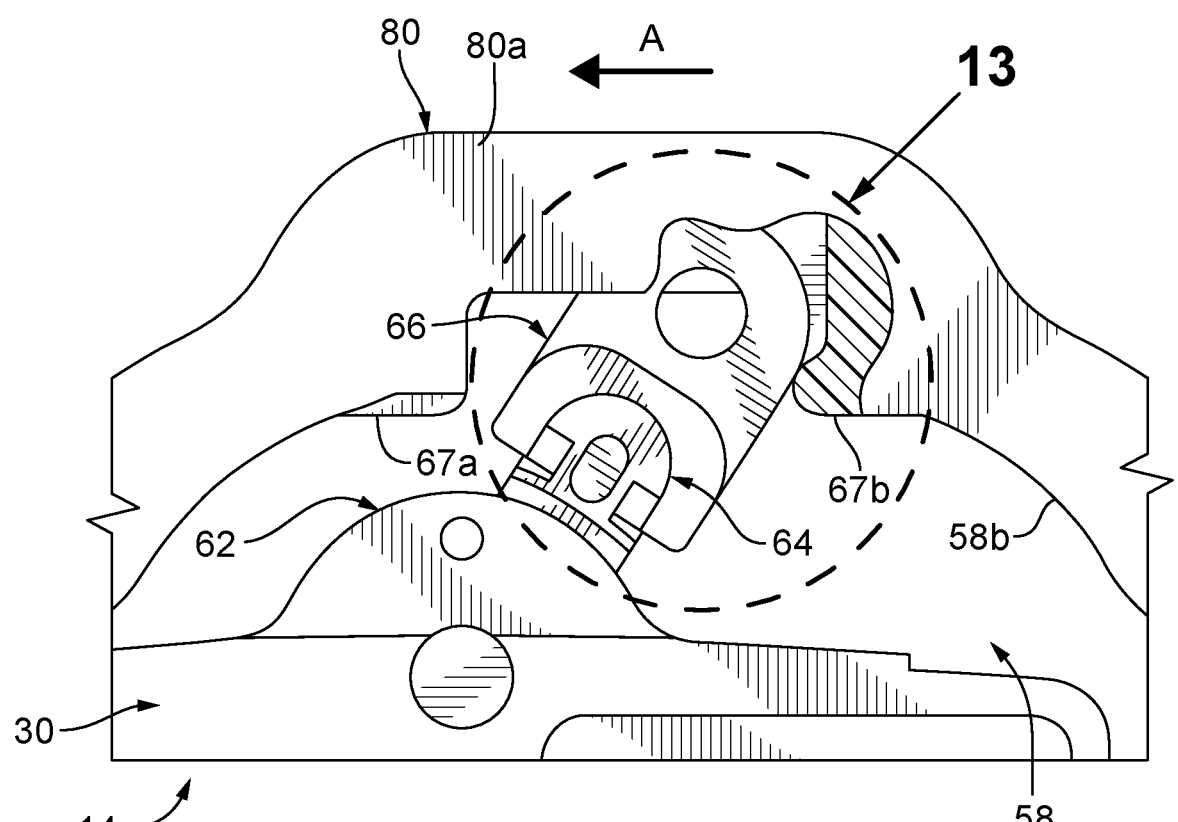
FIG. 12 is the enlarged side elevation view of the portion of the slider actuator of FIG. 11, illustrating the slider actuator moving a toggle extender and toggle.
Figure 13:
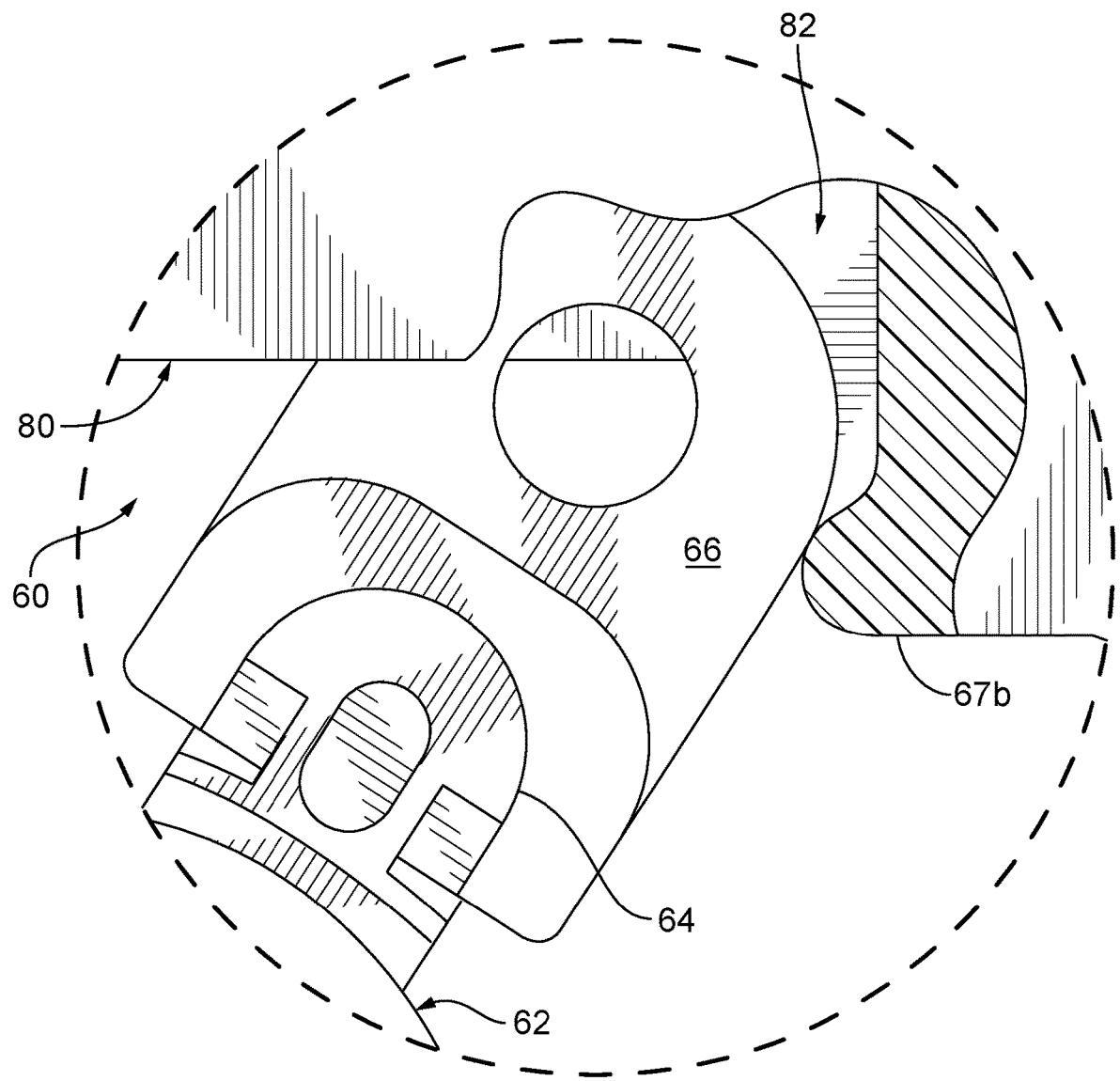
FIG. 13 is an enlarged side elevation view of the toggle extender of FIG. 12 within a second recess and slot in the slider actuator of FIG. 12 and a wedge of the slider actuator engaging the toggle extender.
Figure 14:
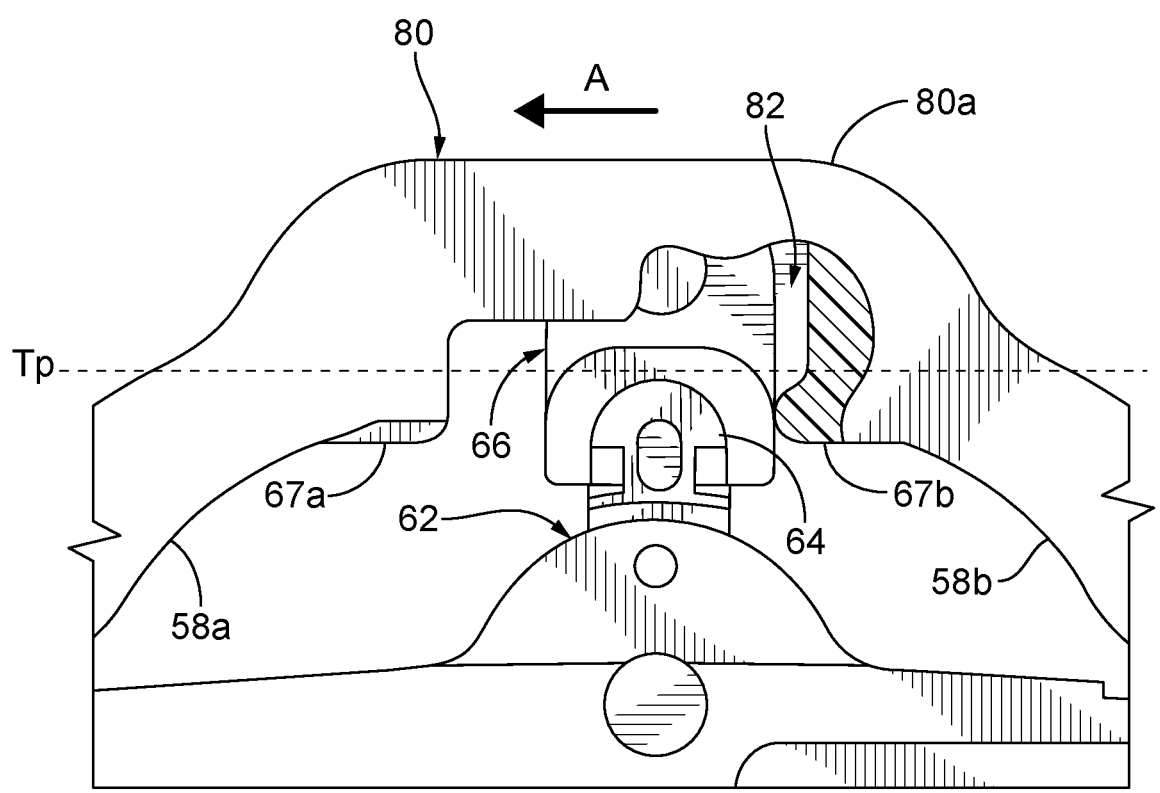
FIG. 14 is the enlarged side elevation view of the portion of the slider actuator of FIG. 11, illustrating the slider actuator moving a toggle extender and toggle.
Figure 15:
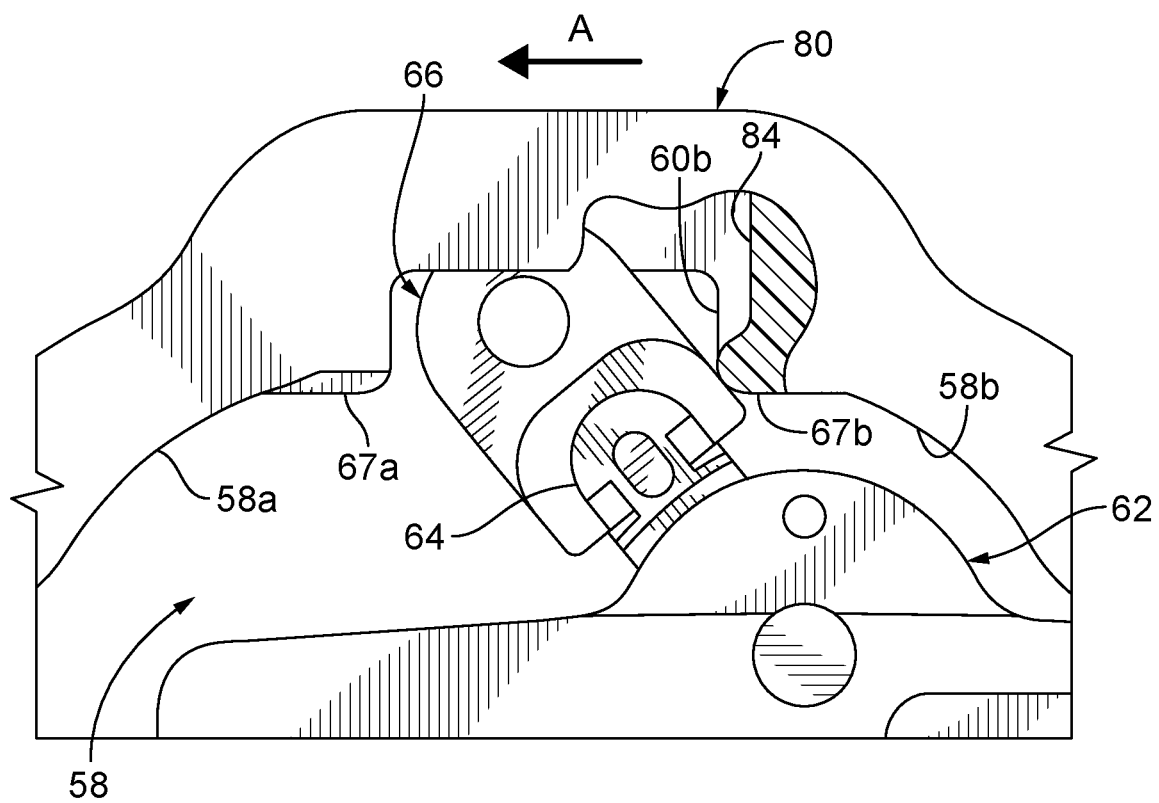
FIG. 15 is the enlarged side elevation view of the portion of the slider actuator of FIG. 11, illustrating the slider actuator moving a toggle extender and toggle.

Referring to FIGS. 11-15, the operation of the wedges 67 of the slider actuator 20 will be described. Initially, the circuit breaker 14 is in either the on-position or the off-position where the toggle 64 and toggle extender 66 are at rest as seen in FIG. 11. For the purpose of this exemplary description this initial state of the circuit breaker is the off-position. As shown in FIG. 11, the wedge 67a is in contact with the toggle extender 66 and a gap exists between the wedge 67b and the toggle extender 66. With the circuit breaker in this initial state, to toggle the circuit breaker 14 to the on-position, the handle 38 of the handle assembly 18 is rotated causing the trip bracket assembly 46 to rotate as described above. Rotation of the trip bracket assembly 46 causes linear movement of the slider actuator 20 in the direction of arrow "A" as shown in FIG. 12. As the slider actuator 20 moves in the direction of arrow A, the wedge 67b contacts the toggle extender 66 as shown in FIG. 13. As the slider actuator 20 continues to move in the direction of arrow A, the wedge 67b pushes the toggle extender 66 and thus the toggle 64 at a point below the longitudinal trip line "$T_P$" of the combination of the toggle extender 66 and toggle 64, seen in FIG. 14. By pushing the toggle extender 66 and toggle 64 below the longitudinal trip line the wedge 67b applies a positive force to the toggle extender 66 in the direction of arrow A as shown in FIG. 14. Applying a positive force to the toggle extender 66 minimizes the risk that the circuit breaker may not properly toggle. Further movement of the wedge 67b in the direction of arrow A fully toggles the circuit breaker so that the toggle 64 and toggle extender 66 are at rest in the on-position as shown in FIG. 15.

The foregoing specific embodiments represent just some of the ways of practicing the present invention. Many other embodiments are possible within the spirit of the present disclosure. Accordingly, the scope of the invention is not limited to the foregoing specification, but instead is given by the appended claims along with their full range of equivalents.

What is claimed is:

1. An actuator assembly for an electrical switch housed in an electrical enclosure having a cover, the actuator assembly comprising:
   a slider actuator having a first slotted portion in a first upper exterior surface of the slider actuator, a second slotted portion in a second upper exterior surface of the slider actuator and a bridge portion connecting the first slotted portion to the second slotted portion, the first and second upper exterior surfaces being in a first horizontal plane and the bridge portion having a third upper exterior surface in a second horizontal plane spaced above the first horizontal plane, the bridge portion having a first recess positioned below the third upper exterior surface and a second recess within the first recess that is smaller in length than the first recess, the slide actuator being configured to be slidably mounted over the electrical switch and engage a toggle of the electrical switch, the slider actuator having a drive link that extends in a direction away from the electrical switch and has first and second surfaces; and
   a handle assembly including a handle for positioning above the cover, a trip bracket for positioning below the cover and a shaft connecting the handle to the trip bracket, the trip bracket having a first ear extending in a direction away from the trip bracket and toward the drive link and facing the first surface of the drive link and a second ear extending in the direction away from the trip bracket and toward the drive link and facing the second surface of the drive link such that trip bracket, first ear and second ear straddle a top wall of the drive link,
   wherein rotation of the handle causes the trip bracket to rotate and rotation of the trip bracket causes linear movement of the slider actuator.

2. The actuator assembly of claim 1, wherein the first slotted portion is configured to receive a first guide and the second slotted portion is configured to receive a second guide, and wherein the first and second guides guide sliding movement of the slider actuator relative to the toggle of the electrical switch.

3. The actuator assembly of claim 2, wherein the first guide includes a head portion and the second guide includes a head portion, and wherein each slotted portion includes a lip slidably supporting a respective guide.

4. The actuator assembly of claim 1, wherein each ear has a convex surface for engaging the respective surface of the drive link.

5. The actuator assembly of claim 1, wherein the first ear and the second ear comprises a cylindrical member for engaging the respective surface of the drive link.

6. The actuator assembly of claim 1, wherein a longitudinal axis of the first ear and the second ear are radially offset from the longitudinal axis of the shaft.

7. The actuator assembly of claim 1, wherein the slider actuator is made of an acetal homopolymer material.

8. The actuator assembly of claim 1, wherein the first slotted portion includes a longitudinal slot and second slotted portion includes a longitudinal slot.

9. An actuator assembly for a circuit breaker housed in an electrical enclosure having a cover, the actuator assembly comprising:

a handle assembly including a handle to be positioned above the cover, a trip bracket to be positioned below the cover and a shaft connecting the handle to the trip bracket;

a slider actuator including:
- a first slotted portion in a first upper exterior surface of the slider actuator, a second slotted portion in a second upper exterior surface of the slider actuator and a bridge portion connecting the first slotted portion to the second slotted portion, the first and second upper exterior surfaces being in a first horizontal plane and the bridge portion having a third upper exterior surface in a second horizontal plane spaced above the first horizontal plane, the first slotted portion being configured to receive a first guide and the second slotted portion being configured to receive a second guide, wherein the first and second guides are configured to guide movement of the slider actuator;
- a first recess disposed under the bridge portion and extending along a length of the slider actuator a first distance sufficient to be positioned over a toggle of the circuit breaker when installed;
- a second recess formed within the first recess and extending along a length of the first recess a second distance sufficient to receive the toggle of the circuit breaker, the second distance being less than the first distance; and
- a drive link adapted to be engaged with the trip bracket such that rotation of the handle causes rotation of the trip bracket and rotation of the trip bracket translates to linear movement of the slider actuator.

10. The actuator assembly of claim 9, further comprising at least one wedge extending from a wall of the first recess adjacent the second recess so that the at least one wedge can engage the toggle of the circuit breaker when the slider moves.

11. The actuator assembly of claim 9, wherein the first slotted portion includes a longitudinal slot and second slotted portion includes a longitudinal slot.

12. The actuator assembly of claim 9, wherein each slotted portion includes a lip slidably supporting a respective guide.

13. An electrical switch enclosure comprising:
an enclosure body;
a cover removably secured to the enclosure body and having a plurality of openings extending through the cover;
a plurality of electrical switches mounted within the enclosure body, wherein each of the plurality of electrical switches includes an upper part having a toggle movable between an on-position and an off-position, and a lower part for mounting the electrical switch within the enclosure;
a plurality of actuator assemblies, wherein one of the plurality of actuator assemblies is associated with one of the plurality of electrical switches, each of the plurality of actuator assemblies including:
a handle assembly having a shaft extending through one of the plurality of openings, a handle attached to an end of the shaft above the cover and a trip bracket attached to an end of the shaft below the cover; and
a slider actuator slidably mounted over the electrical switch by a first guide and a second guide, the slider actuator having a first slotted portion, a second slotted portion and a bridge portion connecting the first slotted portion to the second slotted portion, the first slotted portion being configured to receive the first guide and the second slotted portion being configured to receive the second guide, the first and second guides guide movement of the slider actuator, the bridge portion including a first recess disposed under the bridge and a second recess within the first recess that is smaller in length than the first recess in which the toggle is inserted, the slider actuator having a drive link that extends in a direction towards the cover, the drive link having a top surface, a first surface and a second surface;
wherein the trip bracket includes a first ear and a second ear that straddle the top surface of the drive link such that the first ear faces the first surface and the second ear faces the second surface, such that rotation of the handle causes rotation of the trip bracket and rotation of the trip bracket translates to linear movement of the slider actuator causing the toggle to move to the on-position or the off-position.

14. The electrical switch enclosure of claim 13, wherein the first recess includes at least one wedge extending from a wall of the first recess so that the at least one wedge engages the toggle when the toggle is moved to the on-position or the off-position.

15. The electrical switch enclosure of claim 13, further comprising a plurality of bushings, wherein one of the plurality of bushings is secured within one of the plurality of openings, and wherein the shaft of the handle assembly associated with the opening extends through the bushing.

16. The electrical switch enclosure of claim 13, further comprising a front panel having a plurality of panel openings, the front panel being positioned between the plurality of electrical switches and the slider actuators such that the toggle of one of the plurality electrical switches extends through one of the plurality of panel openings.

17. The electrical switch enclosure of claim 13, wherein the first slotted portion includes a longitudinal slot and the second slotted portion includes a longitudinal slot.

18. The electrical switch enclosure of claim 13, wherein the first slotted portion includes a first lip over which a head of the first guide rests, and the second slotted portion includes a second lip over which a head of the second guide rests to at least limit the slider actuator from movement in a direction toward the cover.

19. The electrical switch enclosure of claim 13, wherein the slider actuators and handle assemblies are disposed in a staggered manner such that the drive links of any two adjacent slider actuators are located on opposite sides of the toggle of the respective electrical switch.

20. The electrical switch enclosure of claim 13, wherein the first ear has a convex surface for engaging the first surface of the drive link, and the second ear has a convex surface for engaging the second surface of the drive link.

21. The electrical switch enclosure of claim 13, wherein the first ear comprises a cylindrical member, and the second ear comprises a cylindrical member.

22. The electrical switch enclosure of claim 13, wherein a longitudinal axis of the first ear and a longitudinal axis of the second ear are radially offset from a longitudinal axis of the shaft.

23. The electrical switch enclosure of claim 13, wherein the slider actuator is made of an acetal homopolymer material.

24. The electrical switch enclosure of claim 13, wherein each of the plurality of electrical switches includes a toggle extender attached to the toggle and wherein the slider actuator includes a second recess within the recess that receives the toggle extender.

25. The electrical switch enclosure of claim 13, wherein each of the plurality of electrical switches comprises a circuit breaker.

26. An electrical switch enclosure comprising:
an enclosure body;
a cover removably secured to the enclosure body and having a plurality of openings extending through the cover;
a plurality of electrical switches mounted within the enclosure body, wherein each of the plurality of electrical switches include an upper part having a toggle and a toggle extender coupled to the toggle, the toggle and toggle extender being movable between an on-position and an off-position, and a lower part for mounting the electrical switch within the enclosure;
a plurality of actuator assemblies, wherein one of the pluralities of actuator assemblies is associated with one of the plurality of electrical switches, each of the plurality of actuator assemblies includes:
  a handle assembly having a shaft extending through one of the plurality of openings, a handle attached to an end of the shaft above the cover and a trip bracket attached to an end of the shaft below the cover;
  a slider actuator slidably mounted over the toggle and toggle extender by a first guide and a second guide, the slider actuator comprising:
    a first slotted portion, a second slotted portion and a bridge portion connecting the first slotted portion to the second slotted portion, the first slotted portion being configured to receive the first guide and the second slotted portion being configured to receive the second guide, the bridge having an upper surface lying in a horizontal plane spaced above the first and second slotted portions;
    a first recess disposed under the bridge portion and extending along a length of the slider actuator a first distance in which the toggle is positioned;
    a second recess formed within the first recess and extending along a length of the first recess a second distance in which the toggle extender is positioned, the second distance being less than the first distance; and
  a drive link operatively coupled to the trip bracket such that rotation of the handle causes rotation of the trip bracket and rotation of the trip bracket translates to linear movement of the slider actuator so that the slider actuator moves the toggle extender and toggle to the on-position or the off-position.

27. The electrical switch enclosure of claim 26, wherein the first recess includes at least one wedge extending from a wall of the first recess so that the at least one wedge engages the toggle or the toggle extender when the toggle and toggle extender move to the on-position or the off-position.

28. The electrical switch enclosure of claim 26, further comprising a plurality of bushings, wherein one of the plurality of bushings is secured within one of the plurality of openings, and wherein the shaft of the handle assembly associated with the opening extends through the bushing.

29. The electrical switch enclosure of claim 26, further comprising a front panel having a plurality of panel openings, the front panel being positioned between the plurality of electrical switches and the slider actuators such that the toggle and toggle extender of one of the plurality electrical switches extends through one of the plurality of panel openings.

30. The electrical switch enclosure of claim 29, wherein at least a portion of the first guide passes through the first slotted portion and is secured to the front panel and at least a portion of the second guide passes through the second slotted portion and is secured to the front panel, and wherein the first and second guides guide the slider actuator relative to the front panel and respective electrical switch as the slider actuator moves the toggle and toggle extender to the on-position or the off-position.

31. The electrical switch enclosure of claim 26, wherein the first slotted portion includes a longitudinal slot and the second slotted portion includes a longitudinal slot.

32. The electrical switch enclosure of claim 26, wherein the first slotted portion includes a first lip over which a head of the first guide rests, and the second slotted portion includes a second lip over which a head of the second guide rests to at least limit the slider actuator from vertical movement in a direction toward the cover.

33. The electrical switch enclosure of claim 26, wherein the slider actuators and handle assemblies are disposed in a staggered manner such that the drive links of any two adjacent slider actuators are located on opposite sides of the toggle of the respective electrical switch.

34. The electrical switch enclosure of claim 26, wherein the first ear has a convex surface for engaging the first surface of the drive link, and the second ear has a convex surface for engaging the second surface of the drive link.

35. The electrical switch enclosure of claim 26, wherein the first ear comprises a cylindrical member, and the second ear comprises a cylindrical member.

36. The electrical switch enclosure of claim 26, wherein a longitudinal axis of the first ear and a longitudinal axis of the second ear are radially offset from a longitudinal axis of the shaft.

37. The electrical switch enclosure of claim 26, wherein the slider actuator is made of an acetal homopolymer material.

38. The electrical switch enclosure of claim 26, wherein each of the plurality of electrical switches comprises a circuit breaker.

* * * * *